(12) United States Patent
Partlo et al.

(10) Patent No.: US 8,653,437 B2
(45) Date of Patent: Feb. 18, 2014

(54) EUV LIGHT SOURCE WITH SUBSYSTEM(S) FOR MAINTAINING LPP DRIVE LASER OUTPUT DURING EUV NON-OUTPUT PERIODS

(75) Inventors: William N. Partlo, Poway, CA (US); Richard L. Sandstrom, Encinitas, CA (US); Daniel J. W. Brown, San Diego, CA (US); Igor V. Fomenkov, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 229 days.

(21) Appl. No.: 13/157,233

(22) Filed: Jun. 9, 2011

(65) Prior Publication Data

US 2012/0080584 A1 Apr. 5, 2012

Related U.S. Application Data

(60) Provisional application No. 61/404,564, filed on Oct. 4, 2010.

(51) Int. Cl.
*H05G 2/00* (2006.01)
(52) U.S. Cl.
USPC ............... 250/214.1; 250/504 R; 250/205; 372/55
(58) Field of Classification Search
USPC ............ 250/205, 214.1, 214 R, 504 R, 492.1; 372/25, 38.1, 55
See application file for complete search history.

(56) References Cited

U.S. PATENT DOCUMENTS

| | | | |
|---|---|---|---|
| 6,549,551 B2 | 4/2003 | Ness et al. | |
| 6,567,450 B2 | 5/2003 | Myers et al. | |
| 6,625,191 B2 | 9/2003 | Knowles et al. | |
| 6,693,939 B2 | 2/2004 | Klene et al. | |
| 6,792,076 B2 | 9/2004 | Petach et al. | |
| 6,881,971 B2 | 4/2005 | Ahmad | |
| 6,928,093 B2 | 8/2005 | Webb et al. | |
| 7,087,914 B2 | 8/2006 | Akins et al. | |
| 7,164,144 B2 | 1/2007 | Partlo et al. | |
| 7,372,056 B2 | 5/2008 | Hemberg et al. | |
| 7,378,673 B2 | 5/2008 | Bykanov et al. | |

(Continued)

FOREIGN PATENT DOCUMENTS

WO  WO 2011/013779  2/2011

OTHER PUBLICATIONS

International Search Report in related application PCT/US11/50565, dated Jan. 4, 2012, 2 pages, issued by Lee W. Young, Officer of the International Searching Authority.

(Continued)

*Primary Examiner* — Kevin Pyo
(74) *Attorney, Agent, or Firm* — Cymer, LLC

(57) ABSTRACT

A device is disclosed herein which may comprise a droplet generator producing droplets of target material; a sensor providing an intercept time signal when a droplet reaches a preselected location; a delay circuit coupled with said sensor, the delay circuit generating a trigger signal delayed from the intercept time signal; a laser source responsive to a trigger signal to produce a laser pulse; and a system controlling said delay circuit to provide a trigger signal delayed from the intercept time by a first delay time to generate a light pulse that is focused on a droplet and a trigger signal delayed from the intercept time by a second delay time to generate a light pulse which is not focused on a droplet.

21 Claims, 4 Drawing Sheets

(56) References Cited

U.S. PATENT DOCUMENTS

| | | |
|---|---|---|
| 7,405,416 B2 | 7/2008 | Algots et al. |
| 7,415,056 B2 | 8/2008 | Das et al. |
| 7,439,530 B2 | 10/2008 | Ershov et al. |
| 7,465,946 B2 | 12/2008 | Bowering et al. |
| 7,476,886 B2 | 1/2009 | Bykanov et al. |
| 7,491,954 B2 | 2/2009 | Bykanov et al. |
| 7,518,787 B2 | 4/2009 | Bykanov et al. |
| 7,598,509 B2 | 10/2009 | Ershov et al. |
| 7,671,349 B2 | 3/2010 | Bykanov |
| 7,843,632 B2 | 11/2010 | Bowering |
| 7,872,245 B2 | 1/2011 | Vaschenko et al. |
| 7,897,947 B2 | 3/2011 | Vaschenko |
| 7,916,388 B2 | 3/2011 | Bykanov |
| 7,928,416 B2 | 4/2011 | Fomenkov |
| 8,098,712 B2 | 1/2012 | Morcom |
| 2003/0190012 A1* | 10/2003 | Ahmad ........................ 378/119 |
| 2003/0223541 A1* | 12/2003 | Petach et al. .................. 378/119 |
| 2005/0259709 A1 | 11/2005 | Das et al. |
| 2006/0255298 A1 | 11/2006 | Bykanov et al. |
| 2008/0149862 A1* | 6/2008 | Hansson et al. .......... 250/504 R |
| 2008/0175596 A1* | 7/2008 | Morcom ....................... 398/151 |
| 2010/0090133 A1 | 4/2010 | Endo et al. |
| 2010/0294953 A1 | 11/2010 | Vaschenko et al. |
| 2011/0140008 A1 | 6/2011 | Partlo et al. |

OTHER PUBLICATIONS

Written Opinion in related application PCT/US11/50565, dated Jan. 4, 2012, 8 pages, issued Lee W. Young, officer of the International Searching Authority.

U.S. Appl. No. 61/398,452, filed Jun. 24, 2010 entitled Master Oscillator-Power Amplifier Drive Laser With Pre-Pulse for EUV Light Source. (Hou, et al.).

* cited by examiner

EUV LIGHT SOURCE WITH SUBSYSTEM(S) FOR MAINTAINING LPP DRIVE LASER OUTPUT DURING EUV NON-OUTPUT PERIODS

CROSS-REFERENCE TO RELATED APPLICATIONS

The present application claims priority to provisional U.S. Patent Application Ser. No. 61/404,564, filed on Oct. 4, 2010, entitled EUV Light Source with a Temperature Stabilized Drive Laser.

The present application is related to U.S. Patent Application Ser. No. 61/398,452 filed on Jun. 24, 2010, entitled MASTER OSCILLATOR—POWER AMPLIFIER DRIVE LASER WITH PRE-PULSE FOR EUV LIGHT SOURCE; U.S. patent application Ser. No. 12/004,905, filed on Dec. 20, 2007, now U.S. Pat. No. 7,916,388, issued on Mar. 29, 2011, entitled DRIVE LASER FOR EUV LIGHT SOURCE; U.S. patent application Ser. No. 11/786,145 filed on Apr. 10, 2007, now U.S. Pat. No. 7,671,349, issued on Mar. 2, 2010, entitled LASER PRODUCED PLASMA EUV LIGHT SOURCE; U.S. patent application Ser. No. 11/827,803 filed on Jul. 13, 2007, now U.S. Pat. No. 7,897,947, issued on Mar. 1, 2011, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988 filed on Feb. 21, 2006, and published on Nov. 16, 2006, as U.S. 2006/0255298-A1, entitled LASER PRODUCED PLASMA EUV LIGHT SOURCE WITH PRE-PULSE; U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY; U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM; U.S. patent application Ser. No. 11/358,983, filed on Feb. 21, 2006, now U.S. Pat. No. 7,378,673, issued on May 27, 2008, entitled SOURCE MATERIAL DISPENSER FOR EUV LIGHT SOURCE U.S. patent application Ser. No. 11/358,992 filed on Feb. 21, 2006, now U.S. Pat. No. 7,598,509, issued on Oct. 6, 2009, entitled LASER PRODUCED PLASMA EUV LIGHT SOURCE; U.S. patent application Ser. No. 11/174,299 filed on Jun. 29, 2005, now U.S. Pat. No. 7,439,530, issued on Oct. 21, 2008, and entitled, LPP EUV LIGHT SOURCE DRIVE LASER SYSTEM; U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE; U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE; and U.S. patent application Ser. No. 11/644,153 filed on Dec. 22, 2006, and published on Jun. 26, 2008, as U.S. 2008/0149862-A1, entitled, LASER PRODUCED PLASMA EUV LIGHT SOURCE; U.S. patent application Ser. No. 11/505,177 filed on Aug. 16, 2006, now U.S. Pat. No. 7,843,632, issued on Nov. 30, 2010, entitled EUV OPTICS; U.S. patent application Ser. No. 11/452,558 filed on Jun. 14, 2006, now U.S. Pat. No. 7,518,787, issued on Apr. 14, 2009, entitled DRIVE LASER FOR EUV LIGHT SOURCE; U.S. Pat. No. 6,928,093, issued to Webb, et al., on Aug. 9, 2005, entitled LONG DELAY AND HIGH TIS PULSE STRETCHER; U.S. application number Ser. No. 11/394,512, filed on Mar. 31, 2006, now U.S. Pat. No. 7,415,056, issued on Aug. 19, 2008, entitled CONFOCAL PULSE STRETCHER; U.S. application Ser. No. 11/138,001, filed on May 26, 2005, and published on Nov. 24, 2005, as U.S. 2005/0259709-A1, entitled SYSTEMS AND METHODS FOR IMPLEMENTING AN INTERACTION BETWEEN A LASER SHAPED AS A LINE BEAM AND A FILM DEPOSITED ON A SUBSTRATE; and U.S. application Ser. No. 10/141,216, filed on May 7, 2002, now U.S. Pat. No. 6,693,939, issued on Feb. 17, 2004, entitled, LASER LITHOGRAPHY LIGHT SOURCE WITH BEAM DELIVERY; U.S. Pat. No. 6,625,191, issued to Knowles et al., on Sep. 23, 2003, entitled VERY NARROW BAND, TWO CHAMBER, HIGH REP RATE GAS DISCHARGE LASER SYSTEM; U.S. application Ser. No. 10/012,002, filed on Nov. 30, 2001, now U.S. Pat. No. 6,625, 191, issued on Sep. 23, 2003; U.S. Pat. No. 6,549,551 issued to Ness, et al., on Apr. 15, 2003, entitled INJECTION SEEDED LASER WITH PRECISE TIMING CONTROL, U.S. application Ser. No. 09/848,043; and U.S. Pat. No. 6,567,450 issued to Myers, et al., on May 20, 2003, entitled VERY NARROW BAND, TWO CHAMBER, HIGH REP RATE GAS DISCHARGE LASER SYSTEM, U.S. application Ser. No. 09/943,343; U.S. patent application Ser. No. 11/509,925 filed on Aug. 25, 2006, now U.S. Pat. No. 7,476, 886, issued on Jan. 13, 2009, entitled SOURCE MATERIAL COLLECTION UNIT FOR A LASER PRODUCED PLASMA EUV LIGHT SOURCE; the entire contents of each of which are hereby incorporated by reference herein.

FIELD

The present application relates to extreme ultraviolet ("EUV") light sources providing EUV light from a plasma created from a source material and collected and directed to an intermediate location for utilization outside of the EUV light source chamber, e.g., for semiconductor integrated circuit manufacturing photolithography e.g., at wavelengths of around 100 nm and below.

BACKGROUND

Extreme ultraviolet ("EUV") light, e.g., electromagnetic radiation having wavelengths of around 5-100 nm or less (also sometimes referred to as soft x-rays), and including light at a wavelength of about 13 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP"), the required plasma can be produced by irradiating a target material, for example in the form of a droplet, stream or cluster of material, with a laser beam.

Heretofore, LPP systems have been disclosed in which droplets in a droplet stream are irradiated by laser pulses to form a plasma from each droplet at an irradiation site. Also, systems have been disclosed in which each droplet is sequentially illuminated by more than one light pulse. In some cases, each droplet may be exposed to a so-called "pre-pulse" to heat, expand, gasify, vaporize, ionize and/or generate a weak plasma and a so-called "main pulse" to convert most or all of the pre-pulse affected material into plasma and thereby produce an EUV light emission.

As indicated above, one technique to produce EUV light involves irradiating a target material. In this regard, $CO_2$ lasers, e.g., outputting light at infra-red wavelengths, e.g., wavelengths in the range of about 9.2 μm to 10.6 μm, may present certain advantages as a drive laser irradiating a target material in an LPP process. This may be especially true for certain target materials, e.g., materials containing tin. For example, one advantage may include the ability to produce a relatively high conversion efficiency between the drive laser input power and the output EUV power.

In some cases, it may be desirable to employ an Oscillator-Amplifier arrangement to produce the relatively high power main pulses used in the LPP process. Generally, for an LPP light source, EUV output power scales with the drive laser power, and, as a consequence, a relatively large amplifier may be employed. For example, in some arrangements, a multi-chamber amplifier having a one-pass small signal gain on the order of $10^5$ or more may be employed that is seeded with a pulsed oscillator output.

In addition to the amplifier, which may include dozens of mirrors to pass light through a gain media having a folded length of 16-20 meters or more, other optics such as lenses, mirrors, etc., may be employed to expand, steer, and/or focus the beam between the amplifier and the irradiation site. All of these optics are heated during exposure to the pulsed beam and this heat may cause each optic to expand and/or distort. On the other hand, during non-exposure periods, the optics may cool, and behave differently than they did at an elevated temperature. Changes in temperature can cause thermal transients that are difficult to correct due to timescale and/or magnitude, and uncorrected thermal transients can adversely affect beam quality and focusability. Although cooling systems may be employed to reduce the maximum temperature of an optic, they do not always reduce thermal transients associated with irradiation cycles in which an optic is exposed to a pulsed beam for a period of time, followed by a non-exposure period, followed by exposure, etc.

During operation, the output of an EUV light source may be used by a lithography exposure tool such as a stepper or scanner. These exposure tools may first homogenize the beam from the light source and then impart the beam with a pattern in the beam's cross-section, using, for example, a reflective mask. The patterned beam is then projected onto a portion of a resist-coated wafer. Once a first portion of the resist-coated wafer (often referred to as an exposure field) has been illuminated, the wafer, the mask or both may be moved to irradiate a second exposure field, and so on, until irradiation of the resist-coated wafer is complete. During this process, the scanner typically requires a so-called burst of pulses from the light source for each exposure field. For example, a typical burst may last for a period of about 0.5 seconds and include about 20,000 light pulses at a pulse repetition rate of about 40 kHz. In this process, sequential bursts may be temporally separated by an intervening time. During some intervening times, which may last for about a fraction of a second, the exposure tool prepares to irradiate the next exposure field and does not need light from the light source. Longer intervening times may occur when the exposure tool changes wafers or performs metrology, one or more maintenance functions, or some other process that does not require light from the light source.

With the above in mind, Applicants disclose an EUV Light Source with Subsystem(s) for Maintaining LPP Drive Laser Output During EUV Non-Output Periods.

SUMMARY

As disclosed herein, in a first aspect, a device may comprise a droplet generator producing droplets of target material, a sensor providing an intercept time signal when a droplet reaches a preselected location, a delay circuit coupled with the sensor, the delay circuit generating a trigger signal delayed from the intercept time signal, a laser source responsive to a trigger signal to produce a laser pulse, and a system controlling the delay circuit to provide a trigger signal delayed from the intercept time by a first delay time to generate a light pulse that is focused on a droplet and a trigger signal delayed from the intercept time by a second delay time to generate a light pulse which is not focused on a droplet.

In one embodiment of this aspect, the first delay time is longer than the second delay time.

In another embodiment of this aspect, the first delay time is shorter than the second delay time.

In one implementation of this aspect, the sensor comprises a laser source and a detector.

In a particular implementation of this aspect, the delay circuit comprises a digital shift register.

In another aspect, also disclosed herein, a method for producing EUV pulses in at least two burst periods, the burst periods separated by an intervening period may comprise the steps of: generating target material droplets during each burst period and during the intervening period, generating laser pulses during each burst period and during the intervening period, and focusing laser pulses on respective droplets to produce an EUV output during burst periods, and producing a distance between a laser focal spot and droplet during an intervening period.

In a particular implementation of this aspect, the producing step is accomplished by providing different laser trigger timing relative to droplet position for the burst period than the intervening period.

In one implementation of this aspect, the droplets travel along a first path toward an irradiation site during a burst period and the producing step is accomplished by redirecting droplets to a second path nonintersecting with the irradiation site during the intervening period.

In a particular implementation of this aspect, the laser pulses are focused to a focal spot at an irradiation site during a burst period and the producing step is accomplished by moving the focal spot to a location distanced from the irradiation site during the intervening period.

In another aspect, also disclosed herein, an Extreme Ultraviolet (EUV) light source producing EUV pulses in at least two burst periods, the burst periods separated by an intervening period may comprise a droplet generator producing droplets of target material during each burst period and during the intervening period, a laser source producing laser pulses during each burst period and during the intervening period, and a system operable to reconfigure the EUV light source from a burst period configuration in which laser pulses interact with target material to produce an EUV output and an intervening period configuration in which light pulses do not interact with target material to produce an EUV output.

In one embodiment of this aspect, the system provides different laser trigger timing relative to droplet position for the burst period than the intervening period.

In a particular embodiment of this aspect, the trigger timing is delayed in the intervening period relative to the burst period.

In a particular implementation of this aspect, the trigger timing is advanced in the intervening period relative to the burst period.

In one implementation of this aspect, droplets travel along a first path toward an irradiation site during a burst period and the system redirects droplets to a second path nonintersecting with the irradiation site during the intervening period.

In one embodiment of this aspect, the system charges droplets during the intervening period and deflects droplets from the first path using a field selected from the group of fields consisting of an electric field, a magnetic field or a combination thereof.

In a particular embodiment of this aspect, the droplet generator includes a nozzle and the system comprises an actuator moving the nozzle. In one implementation of this aspect, the system comprises a gas flow to redirect droplets.

In a particular implementation of this aspect, the laser pulses are focused to a focal spot at an irradiation site during a burst period and the system moves the focal spot to a location distanced from the irradiation site during the intervening period.

In one arrangement of this aspect, the laser pulses are focused using at least one focusing optic and the system moves at least one focusing optic to change the focal spot location.

In a particular setup of this aspect, the laser pulses are steered using at least one steering optic and the system moves at least one steering optic to change the focal spot location.

In one embodiment of this aspect, the system provides different laser trigger timing relative to droplet position for the burst period than the intervening period, and the laser pulses are focused to a focal spot at an irradiation site during a burst period and the system moves the focal spot to a location distanced from the irradiation site during the intervening period.

DETAILED DESCRIPTION

Figure 1:
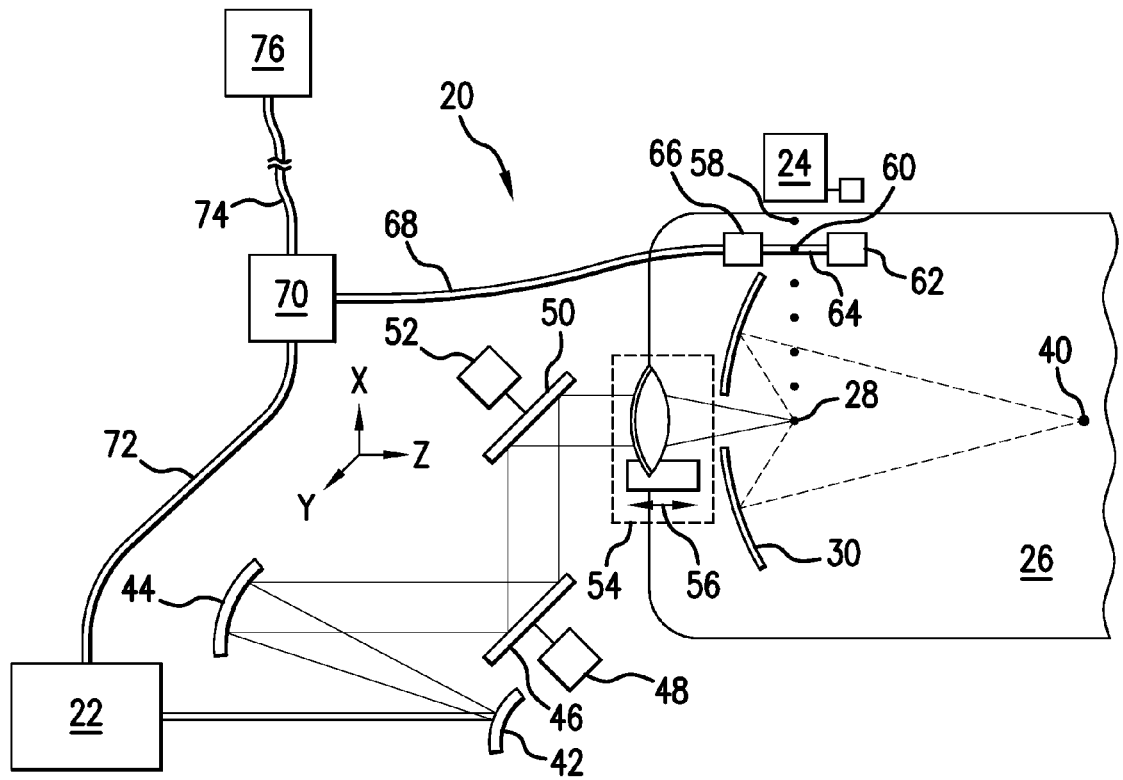
FIG. 1 shows a simplified schematic view of an example of a laser-produced plasma EUV light source.

With initial reference to FIG. 1, there is shown a simplified, schematic view of an embodiment of an EUV light source, e.g., a laser-produced-plasma EUV light source 20. As shown in FIG. 1, the LPP light source 20 may include a system 22 for generating light and delivering the light into a chamber 26. For the source 20, light may travel along one or more beam paths from the system 22 and into the chamber 26 to illuminate a respective target droplet at an irradiation region 28. Examples of laser arrangements that may be suitable for use in the system 22 shown in FIG. 1 are described in more detail below.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., zero, one or more pre-pulses, and thereafter one or more main pulses, to ultimately produce plasma and generate an EUV emission. More details regarding various droplet dispenser configurations and their relative advantages may be found in U.S. patent application Ser. No. 12/721,317, filed on Mar. 10, 2010, and published on Nov. 25, 2010, as U.S. 2010/0294953-A1, entitled LASER PRODUCED PLASMA EUV LIGHT SOURCE; U.S. Ser. No. 12/214,736, filed on Jun. 19, 2008, now U.S. Pat. No. 7,872,245, issued on Jan. 18, 2011, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, now U.S. Pat. No. 7,897,947, issued on Mar. 1, 2011, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988, filed on Feb. 21, 2006, entitled LASER PRODUCED PLASMA EUV LIGHT SOURCE WITH PRE-PULSE; and published on Nov. 16, 2006 as U.S. 2006/0255298A-1; U.S. patent application Ser. No. 11/067,124, filed on Feb. 25, 2005, entitled METHOD AND APPARATUS FOR EUV PLASMA SOURCE TARGET DELIVERY; now U.S. Pat. No. 7,405,416, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof, Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with FIG. 1, the EUV light source 20 may also include an optic 30 such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1 shows that the optic 30 may be formed with an aperture to allow the light pulses generated by the system 22 to pass through and reach the irradiation region 28. As shown, the optic 30 may be, e.g., a prolate spheroid mirror that has a first focus within or near the irradiation region 28 and a second focus at a so-called intermediate region 40, where the EUV light may be output from the EUV light source 20 and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, now U.S. Pat. No. 7,843,632, issued on Nov. 30, 2010, entitled EUV OPTICS, the contents of which are hereby incorporated by reference.

FIG. 1 also shows that the source 20 may include one or more optics for beam conditioning such as expanding, steering, and/or focusing the beam between the laser source system 22 and irradiation site 28. In more detail, it can be seen in FIG. 1 that a beam expander consisting of two mirrors 42, 44, which may be, for example, off-axis parabolic mirrors may be employed to expand the beam output from the system 22 in one or both dimensions transverse to the beam's propagation direction. It is to be appreciated that other optical arrangements including lenses, prisms, etc., may be employed to expand the beam, or a common optic or optics may be used to both expand and steer the beam. The optics may be cooled, for example, using backside water channels in the case of mirrors and/or a surface gas flow.

Continuing with FIG. 1, it can be seen that the steering system, which may include one or more mirrors, prisms, lenses, etc., may be provided and arranged to steer the focal spot in the x and/or y direction. The optics may be cooled, for example, using backside water channels in the case of mirrors and/or a surface gas flow. For the arrangement shown, the steering system includes a first flat mirror 46 mounted on a tip-tilt actuator 48 which may move the mirror 46 independently in two dimensions, and a second flat mirror 50 mounted on a tip-tilt actuator 52 which may move the mirror 50 independently in two dimensions. However, other systems may be employed, for example, a single mirror having a tip-tilt actuator may be employed to provide steering, or one mirror may provide only tilt adjustment, while a second mirror provides only tip adjustment.

FIG. 1 also shows that a focusing assembly 54 may be provided to focus the beam to the irradiation site 28 and adjust the position of the focal spot along the z-axis. For the focusing assembly 54 shown, a focusing lens may be used that is coupled to an actuator for movement in the direction of arrow 56 to move the focal spot along the z-axis. Although a single lens is shown, it is to be appreciated that other focusing arrangements having one or more lenses, mirrors, etc., may be used.

As used herein, the term "optic" and its derivatives includes, but is not necessarily limited to, one or more components which reflect and/or transmit and/or operate on incident light and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or some other wavelength.

Further details regarding beam conditioning systems are provided in U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; U.S. Ser. No. 10/900,839 filed on Jul. 27, 2004, entitled EUV LIGHT SOURCE, now U.S. Pat. No. 7,164,144, issued on Jan. 16, 2007, and U.S. patent application Ser. No. 12/638,092, filed on Dec. 15, 2009, entitled BEAM TRANSPORT SYSTEM FOR EXTREME ULTRAVIOLET LIGHT SOURCE, the contents of each of which are hereby incorporated by reference.

Continuing with FIG. 1, it can be seen that a sensor may be employed to provide an intercept time signal when a droplet 58 reaches a pre-selected location 60 upstream of the irradiation site 28. For example, the pre-selected location may be several millimeters from the irradiation site and may be positioned such that droplet intercept at the preselected location occurs when plasma is not present at the irradiation site. For the source 20, the sensor may include a light source 62, such as a laser source, directing a beam 64 through the preselected location 60, as shown. For example, the laser may be a semiconductor laser. A detector 66, such as a photodetector array, avalanche photodiode or photomultiplier, may be oriented to monitor the beam 64 and generate an analog signal output on communication channel 68, e.g., wire, wireless link, etc., when a droplet 58 passes through the preselected location 60. The analog signal, in turn, may be processed by a control circuit 70 which generates a laser trigger signal to initiate firing of the laser source 22. As further shown, the control circuit 70 may output the trigger signal over communication channel 72. Communication channel 74 may be provided to communicatively connect the control circuit 70 to the exposure tool control system 76. As further described below, with this link, the delay circuit may process Burst Start and Burst Stop commands from the exposure tool.

Figure 2:
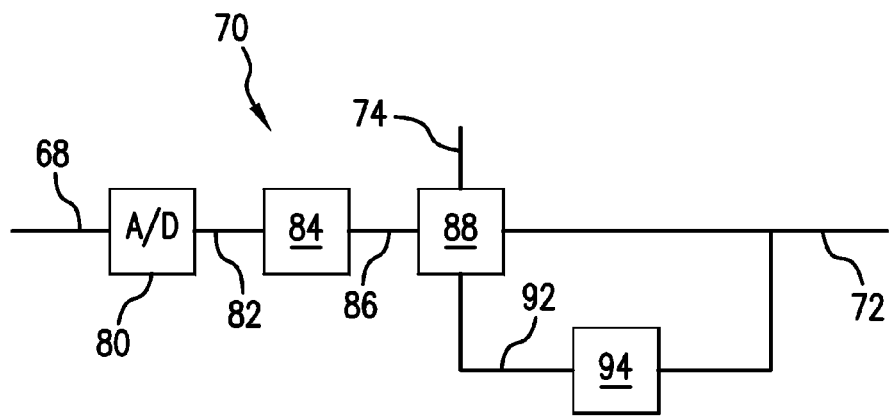
FIG. 2 shows an example of a control circuit for generating a laser trigger upon receiving a droplet intercept time signal.

FIG. 2 shows an example of a suitable control circuit 70 in further detail. As shown there, the analog output on communication channel 68 from the detector 66 (see FIG. 1) may be input to an analog-to-digital convertor 80 producing a digital output on communication channel 82. The digital output on communication channel 82 may then be input to a delay circuit portion 84 which may include, for example, a digital shift register. The delay circuit portion 84 may output a signal on communication channel 86 that is delayed from the input signal by a time associated with the flight time of the droplet from the intercept location 60 (see FIG. 1) to the irradiation site 28. As shown, the output on communication channel 86 may then be input to a logic circuit 88 which may include, for example, a digital microprocessor.

Continuing with FIG. 2, it can be seen that the logic circuit 88 may also include a communication channel 74 for receiving an input from exposure tool control system 76. Specifically, this input may include Burst Start and Burst Stop commands from the exposure tool. With these inputs, logic circuit 88 may execute the following instruction sequence. Upon receiving a Burst Start command from the exposure tool, the logic circuit 88 outputs communication channel 86 to communication channel 72 triggering the laser source 22 (see FIG. 1) to irradiate the intercepted droplet and subsequent droplets until a Burst Stop command is received.

Upon receiving a Burst Stop command from the exposure tool, the logic circuit 88 passes the input from communication channel 86 to communication channel 92 until the logic circuit receives a Burst Start command, Signals on communication channel 92 are then received by delay circuit portion 94, which may include, for example, a digital shift register. The delay circuit portion 94 may then output a signal on communication channel 72 that is delayed from the communication channel 92 input signal by a time sufficient to cause the laser beam to reach the irradiation site late and miss the droplet. For example, assuming a laser pulse repetition rate of 40 kHz, the temporal spacing between droplets is about 25 µs and a suitable delay for the delay circuit portion 94 may be about half the droplet temporal spacing, i.e., about 12.5 µs.

With the arrangement as described above, the laser source 22 continues to output light pulses during an intervening time, t, between a Burst Stop command and a Burst Start command. These output pulses irradiate one or more optics but do not create plasma from the droplets. Thus, the temperature of the optics may be maintained reducing thermal transients without producing plasma-generated debris and ions that can foul or harm nearby optics such as the collector mirror 30 (shown FIG. 1). Also, for this arrangement, the droplet generator may continue to produce droplets uninterrupted during the intervening time period reducing complexities associated with stopping and re-starting the droplet generator.

Figure 3:
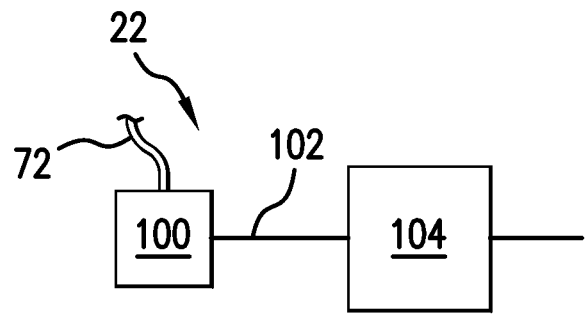
FIG. 3 shows a simplified schematic of an embodiment of a laser source having a seed laser and amplifier.

As indicated above, the trigger signal output on communication channel 72 may be used to initiate firing of the laser source 22 shown in FIG. 1. FIG. 3 shows an example of a laser source 22 in more detail. As shown in FIG. 3, the laser source 22 may include a seed laser 100 producing an output that is directed onto a beam path 102 through amplifier 104.

In one setup, the seed laser 100 may be a $CO_2$ laser having a sealed gas including $CO_2$ at sub-atmospheric pressure, e.g. 0.05-0.2 atm, that is pumped by a radio-frequency (RF) discharge. With this arrangement, the seed laser may self-tune to one of the dominant lines such as the 10P(20) line having wavelength 10.5910352 µm. Upon receiving a trigger signal on communication channel 72 pumping of the gain media may be initiated resulting in a pulsed laser output. Alternatively, an acousto-optic modulation (AOM) switch may be provided to control the quality, Q, of the seed laser optical cavity. In this case, the gain media may be in a pumped state prior to the seed laser receiving the trigger signal, e.g., due to continuous RF pumping, and the trigger signal on communication line 72 may be used to activate the Q-switch. Alternatively, the trigger signal may initiate gain media pumping and the Q-switch activated after a pre-determined delay. For this arrangement, the gain media in the amplifier chambers 104 may be in a pumped state (using either continuous or pulsed pumping) at the time the trigger signal is received by the seed laser 100.

For the laser source 22 shown in FIG. 3, a suitable amplifier 104 for use with a seed laser having a gain media including $CO_2$ described above may include a gain media containing $CO_2$ gas that is pumped by DC or RF excitation. In one particular implementation, the amplifier may include an axial-flow, RF-pumped (continuous or with pulse modulation) $CO_2$ amplification unit. Other types of amplification units having fiber, rod, slab or disk-shaped active media may be used. In some cases, a solid active media may be employed.

Figure 4:
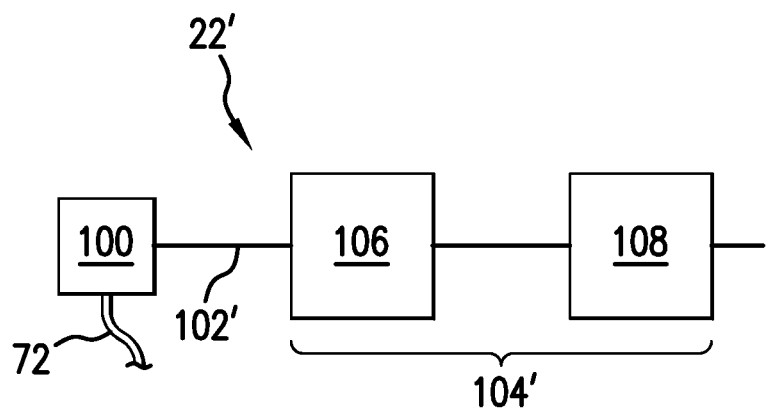
FIG. 4 shows a simplified schematic of another embodiment of a laser source having a seed laser and multi-chamber amplifier.

FIG. 4 shows another example of a laser source 22' for use in the light source 20 shown in FIG. 1. As shown in FIG. 4, the laser source 22' may include seed laser 100 producing an output that is directed onto beam path 102' and through amplifier 104'. As further shown, amplifier 104' may have two (or more) amplification units 106, 108, each having its own chamber, active media and excitation source, e.g., pumping electrodes. For example, for the case where the seed laser 100 include gain media, including $CO_2$ described above, suitable lasers for use as amplification units 106, 108, may include an active media containing $CO_2$ gas that is pumped by DC or RF excitation. In one particular implementation, the amplifier may include a plurality, such as four or five, axial-flow, RF-pumped (continuous or pulsed) $CO_2$ amplification units having a total gain length of about 10-25 meters, and operating, in concert, at relatively high power, e.g., 10 kW or higher. Other types of amplification units having fiber, rod, slab or disk-shaped active media may be used. In some cases, a solid active media may be employed.

For the embodiment shown in FIG. 4, a trigger signal from communication channel 72 may initiate pumping of the gain media resulting in a pulsed laser output. Alternatively, an acousto-optic modulation (AOM) switch may be provided to control the quality, Q, of the seed laser optical cavity. In this case, the gain media may be in a pumped state prior to the seed laser receiving the trigger signal, e.g., due to continuous RF pumping and the trigger signal on communication line 72 may be used to activate the Q-switch. Alternatively, the trigger signal may initiate gain media pumping and the Q-switch activated after a pre-determined delay. For this arrangement, the gain media in the amplifier chambers 106, 108, may be in a pumped state (using either continuous or pulsed pumping) at the time the trigger signal is received by the seed laser 100.

Figure 5:
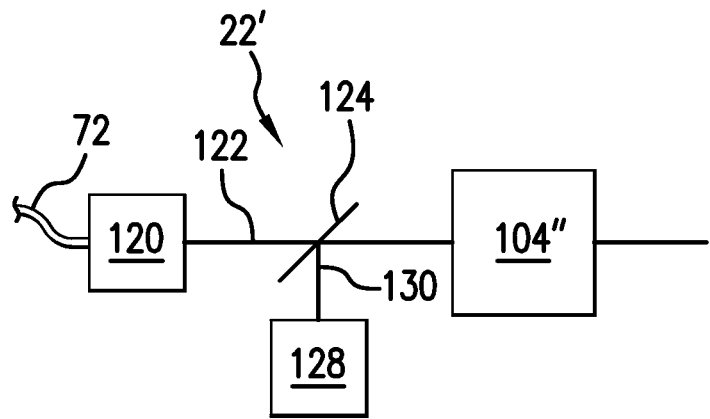
FIG. 5 shows a simplified schematic of another embodiment of a laser source having a pre-pulse seed laser, main pulse seed laser and common amplifier.

FIG. 5 shows another example of a laser source 22' for use in the light source 20 shown in FIG. 1. As shown in FIG. 5, the laser source 22' may include a pre-pulse seed laser 120 producing an output that is directed onto a common beam path 122 through optic 124 and through common amplifier 104" (as described above for amplifiers 104, 104'). Laser source 22' may also include a main pulse seed laser 128 producing an output on beam path 130 that is reflected by optic 124 onto common beam path 122 and through common amplifier 126. For the arrangement shown in FIG. 5, the optic 122 may be a dichroic beam combiner, polarization discriminating beam combiner, or partially reflecting beam combiner. It is to be appreciated that the arrangement may be modified such that the pre-pulse seed laser output is transmitted through the optic 124, and the main pulse seed laser output is reflected by the optic 124.

For the arrangement shown in FIG. 5, a tunable pre-pulse seed laser 120, such as a $CO_2$ laser having a sealed gas including $CO_2$ at sub-atmospheric pressure, e.g., 0.05-0.2 atm, that is pumped by a radio-frequency discharge may be used. For example, a movable grating may be used together with an output coupler to form the optical cavity of the pre-pulse laser. An actuator, which may include a stepper motor, piezoelectric element/stack or a combination stepper motor/piezoelectric, may be used to move the grating in response to a center wavelength measurement signal. In one setup, the main pulse seed laser 128 may be a $CO_2$ laser having a sealed gas including $CO_2$ at sub-atmospheric pressure, e.g. 0.05-0.2 atm, that is pumped by a radio-frequency discharge. With this arrangement, the main pulse seed laser may self-tune to one of the dominant lines such as the 10P(20) line having wavelength 10.5910352. Typically, the pre-pulse seed laser 120 is fired in response to a trigger signal on communication channel 72, and then, after a pre-determined delay, the main pulse seed laser 128 is fired. The delay between the pre-pulse seed laser 120 and the main pulse seed laser 128 may be about 1000 ns and is typically set to optimize EUV output energy or efficiency.

For the embodiment shown in FIG. 5, a trigger signal from communication channel 72 may initiate pumping of the gain media in pre-pulse seed laser 120 resulting in a pulsed laser output. Alternatively, an acousto-optic modulation (AOM) switch may be provided to control the quality, Q, of the pre-pulse seed laser 120 optical cavity. In this case, the gain media may be in a pumped state prior to the seed laser receiving the trigger signal, e.g., due to continuous RF pumping and the trigger signal on communication line 72 may be used to activate the Q-switch. Alternatively, the trigger signal may initiate gain media pumping and the Q-switch activated after a pre-determined delay. For this arrangement, the gain media in the amplifier chamber 104" may be in a pumped state (using either continuous or pulsed pumping) at the time the trigger signal is received by the pre-pulse seed laser 120.

Figure 6:
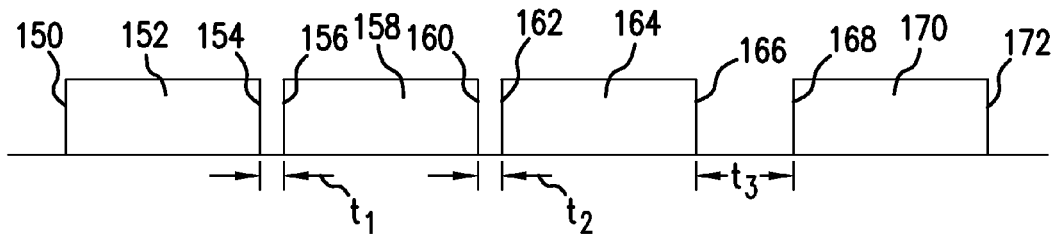
FIG. 6 illustrates a typical light output sequence for a light source used in photolithography.

FIG. 6 illustrates the typical light output of the light source 20 shown in FIG. 1. As seen there, the sequence may begin with a Burst Start command 150 from the exposure tool (not shown) at which point the light source 20 may output a burst 152 of pulses to the exposure tool at a fixed repetition rate until a Burst Stop command 154 is issued. For example, a typical burst may last for a period of about 0.5 seconds and include about 20,000 light pulses at a pulse repetition rate of about 40 kHz. The exposure tool may use a first portion of the burst for setup activities such as alignment, metrology, etc., and the later portion of the burst to illuminate an exposure field on a resist-coated wafer. Once a first portion of the resist-coated wafer has been illuminated, an intervening time, $t_1$, may occur while the wafer, the mask, or both, are moved into position to irradiate a second exposure field. Typically, an intervening time between exposure fields on a same wafer may last for about a fraction of a second. During the intervening time the exposure tool does not need light from the light source. FIG. 6 shows that the intervening time, $t_1$ may cease upon the issuance of another Burst Start command 156 from the exposure tool (not shown) at which point the light source 20 may output a burst 158 of pulses to the exposure tool at a fixed repetition rate to illuminate a second exposure field until a Burst Stop command 160 is issued. Burst 158 is then followed by another intervening time, $t_2$, while the wafer, the mask, or both, are moved into position to irradiate a third exposure field.

Continuing with FIG. 6, the intervening time, $t_2$ may cease upon the issuance of another Burst Start command 162 from the exposure tool (not shown) at which point the light source 20 may output a burst 164 of pulses to the exposure tool at a fixed repetition rate to illuminate a third exposure field until a Burst Stop command 166 is issued. Burst 164 is then followed by another intervening time, $t_3$, which may be longer than intervening times $t_1$ and $t_2$, and may correspond to the time associated with the exposure tool changing wafers or performing various metrology functions, one or more maintenance functions, or some other process that does not require light from the light source.

As further shown, the intervening time, $t_3$ may cease upon the issuance of another Burst Start command 168 from the exposure tool (not shown) at which point the light source 20 may output a burst 170 of pulses to the exposure tool at a fixed repetition rate to illuminate a third exposure field until a Burst Stop command 172 is issued.

EUV output pulse energy may be varied within a burst such that a specified integrated energy or dose is provided. In some implementations, a moving, 500 pulse, window is used to maintain dose substantially constant within the burst. For example, total energy in a 500 pulse window may be measured and the result used to produce an energy target for the next pulse. After the next pulse, the process is repeated. Pulse energy may be adjusted in a variety of ways, including modulating the RF pulses used to pump the amplifier gain media or adjusting the delay between the pre-pulse and main pulse seed outputs. More detailed information on dose control may be found in U.S. patent application Ser. No. 11/644,153, filed on Dec. 22, 2006, and published on Jun. 26, 2008, as U.S. 2008/0149862-A1, entitled LASER PRODUCED PLASMA EUV LIGHT SOURCE, the contents of which are hereby incorporated by reference.

FIGS. 7-12 illustrate alternative devices and methods, wherein a drive laser source continues to output light pulses during an intervening time, t, to reduce thermal transients due to optic temperature changes. For these devices and methods, the droplet generator may continue to produce droplets uninterrupted during the intervening time period reducing complexities associated with stopping and re-starting the droplet generator. Also, for these devices and methods, a substantial amount of plasma is not produced during an intervening time, t, reducing the amount of plasma-generated debris and ions that can foul or harm nearby optics such as the collector mirror 30 (shown FIG. 1). In more detail, in the embodiments shown in FIGS. 7-12, laser pulses are focused on respective droplets to produce an EUV output during burst periods, and a distance between a laser focal spot and droplet is provided during an intervening period. It is to be appreciated that the arrangements shown in FIGS. 7-12 do not necessarily require a different laser timing in a burst period than the timing in an intervening period, as described above with reference to control circuit 70 shown in FIG. 1. For the arrangements described below, the devices and methods may be used for example in an 'open loop' arrangement in which droplet intercepts are not used to trigger the laser source, or in a system where the droplet intercept control loop is deactivated during an intervening period. In some cases, the droplet intercept control loop may be deactivated during an intervening period by deflecting or blocking droplets from reaching the intercept position.

Figure 7:
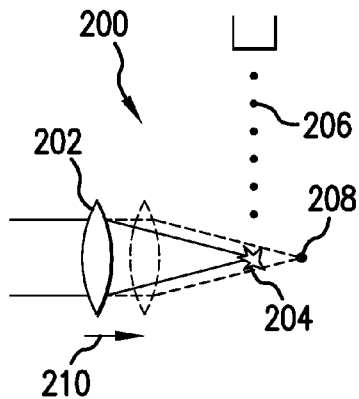
FIG. 7 illustrates an arrangement in which the focal spot generated by a focusing optic is moved from a first focal spot position (solid lines) in which laser pulses are focused on droplets in a droplet stream to produce an EUV emitting plasma, to a second focal spot position (dashed lines) in which the focal spot is distanced from droplets in the droplet stream.

Beginning with FIG. 7, an arrangement 200 is illustrated in which the focal spot generated by focusing optic 202, e.g., lens, is moved from a first focal spot position 204 (solid lines) in which laser pulses are focused on droplets in a droplet stream 206 to produce an EUV emitting plasma, to a second focal spot position 208 (dashed lines), established by moving the focusing optic 202 in the direction of arrow 210, in which the focal spot is distanced from droplets in the droplet stream. An actuator (not shown), which may include a stepper motor, piezoelectric element/stack or a combination stepper motor/piezoelectric, may be used to move the optic 202. For this arrangement, the actuator may move the optic 202, such that a distance between first focal spot position 204 and second focal spot position 208 is sufficient to lower the intensity on droplets during an intervening period to prevent substantial plasma formation due to the interaction between the laser pulses and droplets. Movement of the optic 202 may be performed alone to prevent laser droplet interaction during an intervening period or may be used to together with a system which produces different laser trigger timing relative to droplet position for the burst period than the intervening period, as described above. For example, the two techniques may be used together to produce a larger separation between the focal spot and droplet than may be obtained with one technique.

Figure 8:
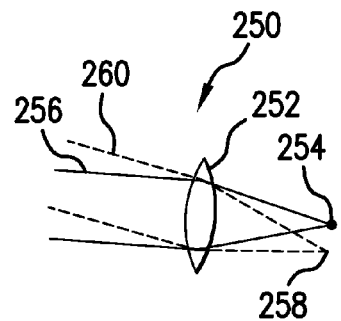
FIG. 8 illustrates an arrangement in which the focal spot generated by a focusing optic is steered from a first focal spot position (solid lines) in which laser pulses are focused on droplets in a droplet stream to produce an EUV emitting plasma, to a second focal spot position (dashed lines) in which the focal spot is distanced from droplets in the droplet stream.

FIG. 8 illustrates an arrangement 250 in which the focal spot generated by focusing optic 252, e.g., lens, is steered from a first focal spot position 254 (solid lines 256) in which laser pulses are focused on droplets in a droplet stream to produce an EUV emitting plasma, and a second focal spot position 258 (dashed lines 260). This steering may be established by moving a steering optic, such as steering optic 46 and/or steering optic 50 shown in FIG. 1, to steer the beam in the X and/or Y direction, to a position in which the focal spot is distanced from droplets in the droplet stream at the time the laser pulse reaches the focal spot. For this arrangement, the beam may be steered such that a distance between first focal spot position 254 and second focal spot position 258 is sufficient to lower the intensity on droplets during an intervening period to prevent substantial plasma formation due to the interaction between the laser pulses and droplets. Movement of a steering optic may be performed alone to prevent laser droplet interaction during an intervening period or may be used to together with a focusing optic movement (see FIG. 7 and description provided above) and/or a system which produces different laser trigger timing relative to droplet position for the burst period than the intervening period, as described above. For example, multiple techniques may be used together to produce a larger separation between the focal spot and droplet than may be obtained with one technique.

Figure 9:
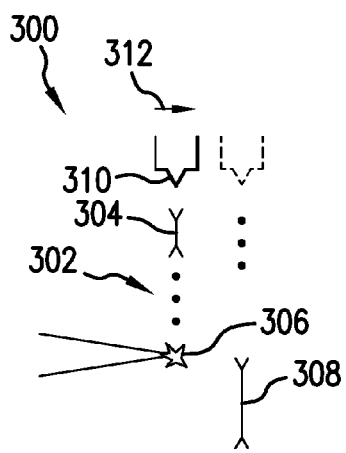
FIG. 9 illustrates an arrangement in which a droplet stream is redirected from a first droplet stream path intersecting an irradiation site for generating EUV to a second droplet stream path non-intersecting with the irradiation site by moving a droplet generator release point.

FIG. 9 illustrates an arrangement 300, in which a droplet stream 302 is redirected from a first droplet stream path 304 intersecting an irradiation site 306 for generating EUV during a burst of pulses to a second droplet stream path 308, non-intersecting with the irradiation site 306 during an intervening time. In more detail, a droplet generator having a release point 310, such as a nozzle output tip, may be used to produce a droplet stream, as shown. During a burst period, the release point 310 may be maintained in a first position resulting in a stream of droplets travelling toward an irradiation site 306 where a pulsed laser beam is focused. At the onset of an intervening period, e.g., upon receipt of a Burst Stop command from the exposure tool, the release point 310 may be moved, e.g., in the direction of arrow 312 to a second location (dashed lines), distanced from the first location (solid lines), such that droplets do not pass through the focal spot at irradiation site 306. Instead, their closest approach to the focal spot at the time the laser pulse reaches the focal spot is distanced from the focal spot by a distance sufficient to lower the intensity on droplets during an intervening period to prevent substantial plasma formation due to the interaction between the laser pulses and droplets.

Movement of the release point can be accomplished by moving the nozzle tip, e.g., relative to the remaining droplet generator, and/or some or all of the droplet generator may be moved. For example, an actuator (not shown), which may include a stepper motor, piezoelectric element/stack or a combination stepper motor/piezoelectric, may be used to move the release point 310 relative to the irradiation site 306.

In an alternative arrangement (not shown), the release point 310 may be moved in the direction of droplet stream travel. Specifically, during a burst period, the release point 310 may be maintained in a first position resulting in a stream of droplets which reach the irradiation site 306 at the same time as a focused laser beam pulse. At the onset of an intervening period, e.g. upon receipt of a Burst Stop command from the exposure tool, the release point 310 may be moved in the direction of droplet propagation to a second location, such that droplets reach the irradiation site 306 before or after a focused laser beam pulse, and thus, do not produce a substantial plasma formation.

In an alternative arrangement (not shown), the timing of droplet formation may be advanced or delayed during the intervening period relative to the burst period. More specifically, as described in more detail in the applications incorporated by reference above with regard to the target material delivery system 24 shown in FIG. 1, a disturbance may be applied to a target material to generate a controlled stream of droplets. For example, an actuator such as a piezoelectric material may be used to periodically disturb a liquid source material causing the material to form a controlled stream of droplets. This periodic disturbance may be, for example, sinusoidal, pulsed, a signal that is amplitude or frequency modulated, or any other signal which produces a controlled stream of droplets. During a burst period, a periodic disturbance may be applied to the target material to produce a controlled stream of droplets which reach the irradiation site at the same time as a focused laser beam pulse. At the onset of an intervening period, e.g., upon receipt of a Burst Stop command from the exposure tool, the periodic disturbance may be modified, e.g., delayed or advanced such that droplets reach the irradiation site 306 before or after a focused laser beam pulse, and thus, do not produce a substantial plasma formation. This system may be used for example in an "open loop" arrangement in which droplet intercepts are not used to trigger the laser source, or in a system where the droplet intercept control loop is deactivated during an intervening period.

The different techniques for modifying the droplet stream described above and below, may be performed alone or in combination to prevent laser droplet interaction during an intervening period or may be used to together with a focusing optic movement (see FIG. 7 and description provided above), movement of a steering optic (see FIG. 8 and description provided above) and/or a system which produces different laser trigger timing relative to droplet position for the burst period than the intervening period, as described above. For example, multiple techniques may be used together to produce a larger separation between the focal spot and droplet than may obtain with one technique.

Figure 10:
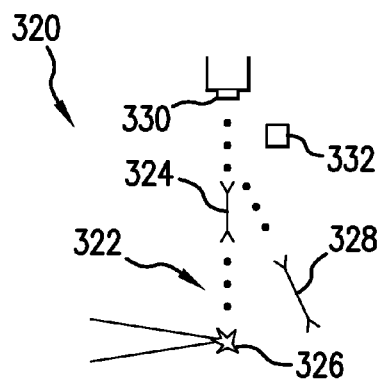
FIG. 10 illustrates an arrangement in which a droplet stream is redirected from a first droplet stream path intersecting an irradiation site for generating EUV to a second droplet stream path non-intersecting with the irradiation site by charging droplets and deflecting charged droplets.

FIG. 10 illustrates an arrangement 320, in which a droplet stream 322 is redirected from a first droplet stream path 324 intersecting an irradiation site 326 for generating EUV during a burst of pulses to a second droplet stream path 328, non-intersecting with the irradiation site 326 during an intervening time. As shown, the arrangement 320 may include a system for producing charged droplets 330 and a deflector 332 for operating on the charged droplets to redirect the charged droplets from their initial path. The system for producing charged droplets 330 may charge droplets before or after droplet formation, and may be distanced from, or integral with, the droplet generator. In one setup, a charging ring is positioned adjacent the droplet generator release point. The deflector 332 may include one or more magnets, electromagnets, a charged element or grid, a pair of spaced-apart charging plates, or a combination thereof. The deflector may operate to deflect droplets via repulsion or attraction generating a field selected from the group of fields consisting of an electric field, a magnetic field or a combination thereof. In an alternate arrangement (not shown), charged droplets may be redirected from a first droplet stream path non-intersecting the irradiation site (i.e., the path used during an intervening time) to a second droplet stream path which intersects with the irradiation site for generating EUV during a burst of pulses.

In another alternative arrangement (not shown), the charged droplets may be accelerated or decelerated in the direction of droplet stream travel by varying the field(s) created by one or more magnets, electromagnets, a charged element or grid, a pair of spaced-apart charging plates or a combination thereof. Specifically, during a burst period, uncharged droplets reach the irradiation site 306 at the same time as a focused laser beam pulse. At the onset of an intervening period, e.g., upon receipt of a Burst Stop command from the exposure tool, the droplets may be charged and then accelerated or decelerated such that droplets reach the irradiation site 306 before or after a focused laser beam pulse, and thus, do not produce a substantial plasma formation.

Figure 11:
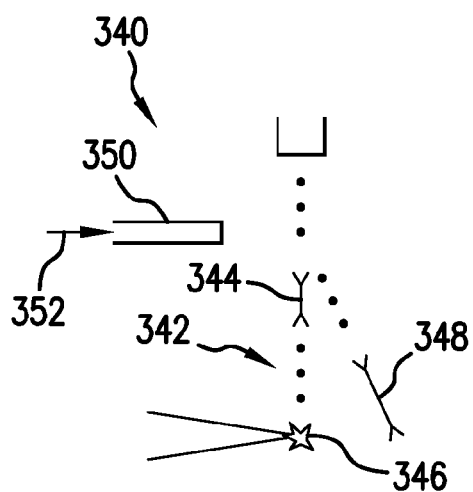
FIG. 11 illustrates an arrangement in which a droplet stream is redirected from a first droplet stream path intersecting an irradiation site for generating EUV to a second droplet stream path non-intersecting with the irradiation site by a gas flow.

FIG. 11 illustrates an arrangement 340 in which a droplet stream 342 is redirected from a first droplet stream path 344 intersecting an irradiation site 346 for generating EUV during a burst of pulses to a second droplet stream path 348, non-intersecting with the irradiation site 346 during an intervening time. As shown, the arrangement 340 may include a system producing a gas flow 350 in the direction of arrow 352 to redirect droplets from their initial path. For example, the system may include a pump and a directing device, such as a tube to produce a directed gas flow. The gas may be a buffer gas such as Hydrogen, Helium or some other gas that is present and/or useful in the chamber such as a cleaning gas, e.g., halogen and/or a gas that is benign in the chamber. Alternatively, a suction (not shown) may be provided to create the gas flow from an existing buffer/cleaning gas to redirect droplets. As another alternative, a flow of gas not shown) may be used to direct droplets from a first droplet stream path non-intersecting the irradiation site (i.e., the path used during an intervening time) to a second droplet stream path which intersects with the irradiation site for generating EUV during a burst of pulses.

In another alternative arrangement (not shown), a gas flow may be used to accelerate or decelerate droplets in the direction of droplet stream travel. For example, a portion of the droplet stream may travel through an elongated tube allowing gas to be directed in the tube and along the droplet stream. During a burst period, gas flow is stopped and droplets reach the irradiation site 306 at the same time as a focused laser beam pulse. At the onset of an intervening period, e.g., upon receipt of a Burst Stop command from the exposure tool, the droplets may be accelerated or decelerated using a gas flow such that droplets reach the irradiation site 306 before or after a focused laser beam pulse, and thus, do not produce a substantial plasma formation.

Figure 12:
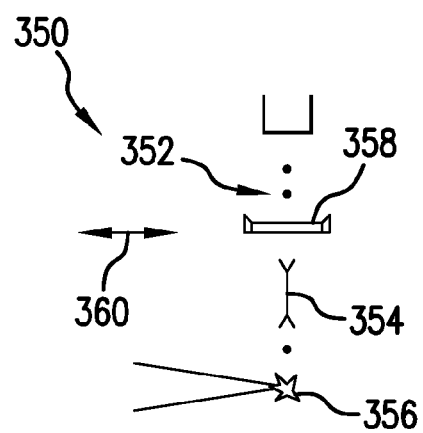
FIG. 12 illustrates an arrangement in which a droplet stream is allowed to travel to an irradiation site for generating EUV during a burst of pulses and is blocked from travelling to the irradiation site during an intervening time.

FIG. 12 illustrates an arrangement 350 in which a droplet stream 352 is allowed to travel along a first droplet stream path 354 intersecting an irradiation site 356 for generating EUV during a burst of pulses, and is blocked from travelling along the path 354 during an intervening time. As shown, the arrangement 340 may include a blocking system having a block 358 such as a plate or pan that is moveable in the direction of arrow 360 from a first position which allows droplets to travel unimpeded along droplet path 354, to a second position in which droplets strike and are collected or deflected by the block. In use, droplets reach the irradiation site 306 during a burst period where they are irradiated by a focused laser beam pulse to produce an EUV emitting plasma. At the onset of an intervening period, e.g., upon receipt of a Burst Stop command from the exposure tool, the block is moved to intercept droplets, such that droplets reach the irradiation site 306, and thus, do not produce a substantial plasma formation.

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above-described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more", All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

We claim:

1. A device comprising;
    a droplet generator producing droplets of target material;
    a sensor providing an intercept time signal when a droplet reaches a preselected location;
    a delay circuit coupled with said sensor, the delay circuit generating, responsive to at least burst timing input from an exposure tool control system, a trigger signal delayed from the intercept time signal;
    a laser source responsive to a trigger signal to produce a laser pulse; and
    a system controlling said delay circuit to provide a trigger signal delayed from the intercept time by a first delay time to generate a light pulse that is focused on a droplet and a trigger signal delayed from the intercept time by a second delay time to generate a light pulse which does not impinge upon a droplet.

2. The device as recited in claim 1 wherein the first delay time is longer than the second delay time.

3. The device as recited in claim 1 wherein the first delay time is shorter than the second delay time.

4. The device as recited in claim 1 wherein the sensor comprises a laser source and a detector.

5. The device as recited in claim 1 wherein the delay circuit comprises a digital shift register.

6. A method for producing EUV pulses in at least two burst periods, the burst periods separated by an intervening period, the method comprising the steps of;
   generating target material droplets during each burst period and during the intervening period;
   generating laser pulses during each burst period and during the intervening period; and
   focusing laser pulses on respective droplets to produce an EUV output during burst periods; and
   producing a distance between a laser focal spot and droplet during an intervening period, wherein at least one laser pulse generated during said intervening period is generated responsive to at least burst timing input from an exposure tool control system such that said at least one laser pulse does not impinge upon said droplet during said intervening period.

7. The method recited in claim 6 wherein said producing step is accomplished by providing different laser trigger timing relative to droplet position for the burst period than the intervening period.

8. The method recited in claim 6 wherein droplets travel along a first path toward an irradiation site during a burst period and said producing step is accomplished by redirecting droplets to a second path nonintersecting with the irradiation site during the intervening period.

9. The method recited in claim 6 wherein the laser pulses are focused to a focal spot at an irradiation site during a burst period and said producing step is accomplished by moving the focal spot to a location distanced from the irradiation site during the intervening period.

10. An Extreme Ultraviolet (EUV) light source producing EUV pulses in at least two burst periods, the burst periods separated by an intervening period, the EUV light source comprising:
   a droplet generator producing droplets of target material during each burst period and during the intervening period;
   a laser source producing laser pulses during each burst period and during the intervening period; and
   a system, responsive to at least burst timing input from an exposure tool control system and operable to reconfigure said EUV light source from a burst period configuration in which laser pulses interact with target material to produce an EUV output and an intervening period configuration in which laser pulses generated during said intervening period do not interact with target material to produce an EUV output during said intervening period.

11. The EUV light source recited in claim 10 wherein said system provides different laser trigger timing relative to droplet position for the burst period than the intervening period.

12. The EUV light source recited in claim 11 wherein said trigger timing is delayed in said intervening period relative to said burst period.

13. The EUV light source recited in claim 11 wherein said trigger timing is advanced in said intervening period relative to said burst period.

14. The EUV light source recited in claim 10 wherein droplets travel along a first path toward an irradiation site during a burst period and said system redirects droplets to a second path nonintersecting with the irradiation site during the intervening period.

15. The EUV light source recited in claim 14 wherein the system charges droplets during the intervening period and deflects droplets from the first path using a field selected from the group of fields consisting of an electric field, a magnetic field or a combination thereof.

16. The EUV light source recited in claim 14 wherein the droplet generator includes a nozzle and the system comprises an actuator moving said nozzle.

17. The EUV light source recited in claim 14 wherein the system comprises a gas flow to redirect droplets.

18. The EUV light source recited in claim 10 wherein the laser pulses are focused to a focal spot at an irradiation site during a burst period and the system moves the focal spot to a location distanced from the irradiation site during the intervening period.

19. The EUV light source recited in claim 18 wherein the laser pulses are focused using at least one focusing optic and the system moves at least one focusing optic to change the focal spot location.

20. The EUV light source recited in claim 18 wherein the laser pulses are steered using at least one steering optic and the system moves at least one steering optic to change the focal spot location.

21. The EUV light source recited in claim 10 wherein said system provides different laser trigger timing relative to droplet position for the burst period than the intervening period and the laser pulses are focused to a focal spot at an irradiation site during a burst period and the system moves the focal spot to a location distanced from the irradiation site during the intervening period.

* * * * *